United States Patent [19]
Arai

[11] 3,986,195
[45] *Oct. 12, 1976

[54] LIGHT RESPONSIVE FIELD EFFECT TRANSISTOR HAVING A PAIR OF GATE REGIONS

[75] Inventor: Michio Arai, Tokyo, Japan

[73] Assignee: Sony Corporation, Tokyo, Japan

[ * ] Notice: The portion of the term of this patent subsequent to Feb. 25, 1992, has been disclaimed.

[22] Filed: Sept. 16, 1974

[21] Appl. No.: 506,123

[30]     Foreign Application Priority Data
Sept. 27, 1973   Japan.............................. 48-109144

[52] U.S. Cl................................. 307/304; 307/311; 357/22; 357/30; 357/43
[51] Int. Cl.².................... H03K 3/353; H03K 3/42; H01L 29/80; H01L 27/14
[58] Field of Search........................ 357/22, 30, 43; 307/304, 311

[56]         References Cited
         UNITED STATES PATENTS
3,340,427   9/1967   Bisso..................................... 357/30
3,868,718   2/1975   Arai....................................... 357/22
3,947,761   3/1976   Arai....................................... 357/22

*Primary Examiner*—William D. Larkins
*Assistant Examiner*—Gene M. Munson
*Attorney, Agent, or Firm*—Hill, Gross, Simpson, Van Santen, Steadman, Chiara & Simpson

[57]           ABSTRACT

A semiconductor device includes a first semiconductive region of a first conductivity type, a second semiconductive region of a second conductivity type adjacent to the first semiconductive region, and a third semiconductive region of the first conductivity type adjacent to the second semiconductive region.

In the semiconductor device, the distance between the first semiconductive region and the third semiconductive region is smaller than the diffusion length of the minority carriers existing in the second semiconductive region. Thus, a photocurrent flowing through the second and third semiconductive regions is amplified by $h_{FE}$ times as much as the current of carriers of the conventional photo-diodes.

2 Claims, 14 Drawing Figures

LIGHT RESPONSIVE FIELD EFFECT TRANSISTOR HAVING A PAIR OF GATE REGIONS

This application is related to my issued U.S. Pat. No. 3,868,718, issued Feb. 25, 1975. This application was filed prior to issuance of said patent and was copending therewith.

BACKGROUND OF THE INVENTION

1. Field of the Invention

This invention relates to a semiconductor device and more particularly to a semiconductor device having a photo-transistor function.

2. Description of the Prior Art

Figure 1:
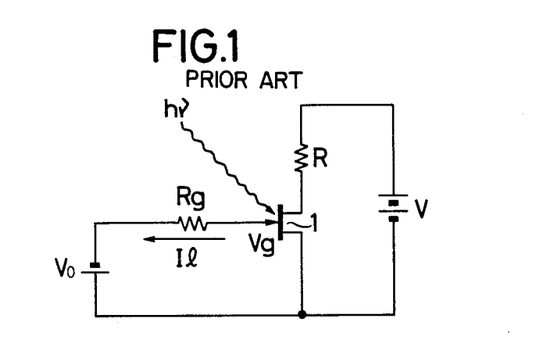
FIG. 1 is a circuit representation of the conventional photo FET.

The conventional photo FET (photo Field Effect Transistor) functions as a photo diode. FIG. 1 is a circuit representation of the conventional photo FET. A gate of the photo FET 1 is connected to a gate control circuit comprising a power source Vo, indicated by reference numeral 32, through a resistor $R_g$. A resistor R and a power source V are connected between a source of the photo FET 1 and a drain thereof. The drain of the photo FET 1 is connected also to the power source $V_o$. A photocurrent $I_e$ flows through the resistor $R_g$ with the irradiation of light having energy $h\nu$. An effective voltage $V_g$ applied to the gate is represented by $V_g = V_o - R_g \times I_e$. The change of the voltage $V_g$ is detected by that of the voltage of the gate region of the photo FET 1. A relationship $R_g \approx V_o/I_e$ is required in order that the gate voltage $V_g$ changes greatly with the photocurrent $I_e$.

Figure 2:
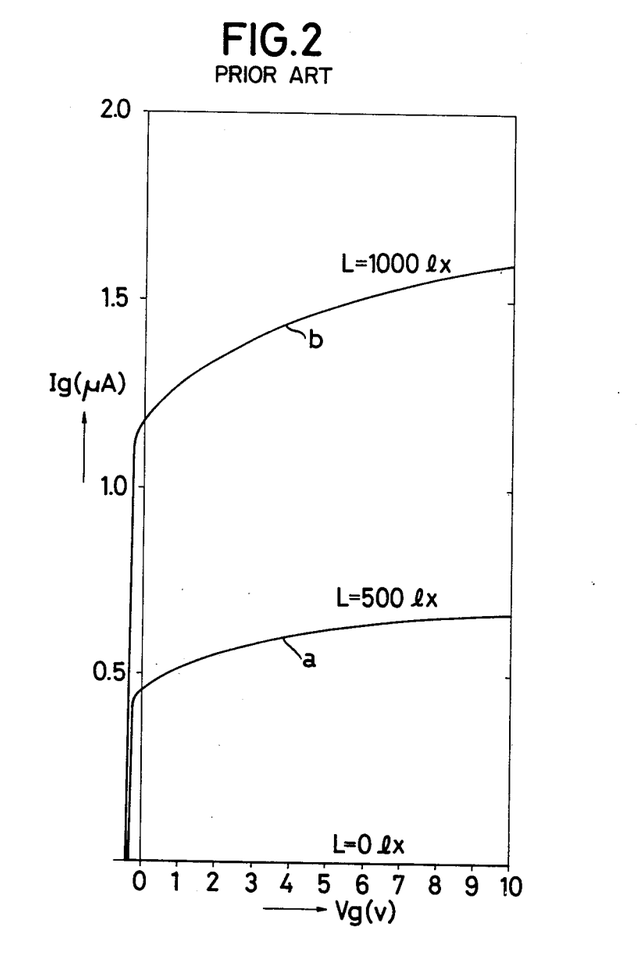
FIG. 2 is a graph representing the relationship between photocurrents or gate currents and gate voltages of the convenional photo FET.

Since the photo FET 1 is of a junction type, a diode is formed between the gage region of the photo FET 1 and the semiconductive substrate thereof. The diode functions as the photo diode. Accordingly, the photo FET 1 has the same characteristic as the normal photo diode (FIG. 2). When no light is incident on the photo FET 1, the gate current $I_g$ is zero. When light with the intensity 500 1X of illumination L and light with the intensity 1000 1X of illumination L are incident on the FET 1 from an incandescent electric lamp, the gate currents $I_g$ vary with the gate voltages $V_g$, as shown by curves a and b. For the 1000 1X light, $R_g \approx 5$ MΩ is obtained from the curve a. For the light with the lower intensity of illumination, the gate resistance $R_g$ is required to be larger. Accordingly, it is troublesome to design the circuit, particularly in an integrated form.

The channel resistance of the photo FET 1 can be changed by another method in which the gate of the photo FET 1 is opened and the photo FET 1 is self-biased by photo electromotive force. However, the effective gate voltage is equal to the open-circuit voltage of the normal photo diode. Therefore, the gate voltage cannot be changed beyond 1V by the irradiation of light. For a great change of the resistance, a junction type FET should be used the channel of which is normally pinched off. It is difficult to manufacture such a junction type FET.

SUMMARY OF THE INVENTION

An object of this invention is to provide a semiconductor device in which photocurrent is greatly amplified and in which an input impedance can be smaller.

Another object of this invention is to provide a semiconductor device which can be used for a light-detecting apparatus and a time constant circuit.

The above, and other objects, features and advantages of the invention, will be apparent in the following detailed description of illustrative embodiments thereof which is to be read in connection with the accompanying drawings.

DESCRIPTION OF THE PREFERRED EMBODIMENTS

A lateral photo FET according to one embodiment of this invention will be described with reference to FIG. 3-FIG. 5.

Figure 3:
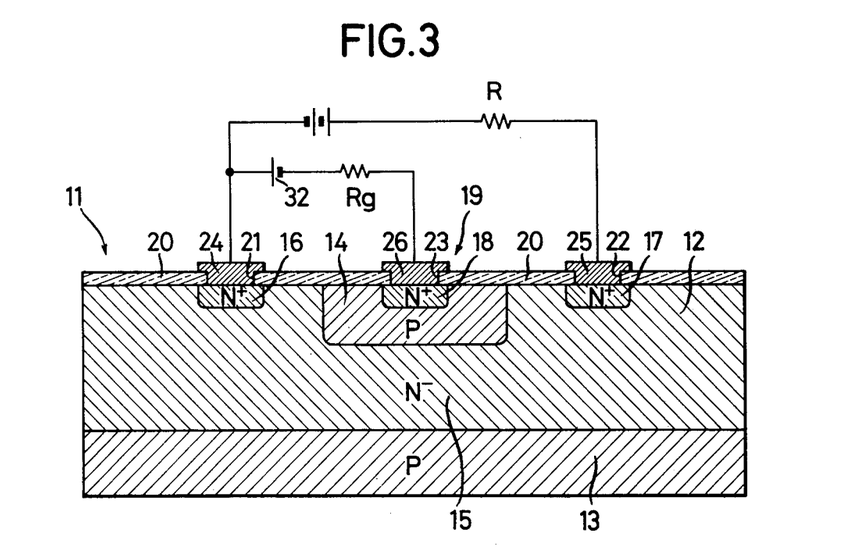
FIG. 3 is a schematic cross-sectional view of a semiconductor device for a photo FET according to one embodiment of this invention.

In a lateral photo FET 11 of FIG. 3, a P-type semiconductive region 13 as a gate region is formed on the lower surface of an N⁻-type semiconductive region 12 by the epitaxial growth method. A P-type semiconductive region 14 as a gate region is formed in the N⁻-type semiconductive region 12 by the diffusion method. The N⁻-type semiconductive region 12 defines an N⁻-type channel 15 between the P-type semiconductive regions 13 and 14. At both sides of the P-type semiconductive region 14, an N⁺-type semiconductive region 16 as a source region and an N⁺-type semiconductive region 17 as a drain region are formed in the N⁻-type semiconductive region 12 by the diffusion method.

The conventional photo FET functioning as a photo diode is formed as above mentioned. In the photo FET 11 according to this invention, moreover an N⁺-type semiconductive region 18 is formed in the P-type semiconductive region 14 by the diffusion method. A transistor 19 is formed by the N⁺-type semiconductive region 18, the P-type semiconductive region 14 and the N⁻-type semiconductive region 12. The photo FET 11 has double-diffused gate regions, in which photocurrent is amplified by the transistor 19. The distance between the N⁺-type semiconductive region 18 and the N⁻-type channel 15 is designed to be smaller than the diffusion length (below mentioned) of electrons injected into the P-type semiconductive region 14. An insulating layer 20 made of $SiO_2$ is deposited on the N⁻-type semiconductive region 12. Openings 21, 22 and 23 made in the insulating layer 20 are closed by a source electrode 24, a drain electrode 25 and a gate electrode 26, respectively.

Next, operations of photo FET 11 will be described with reference to FIG. 4-FIG. 11.

Figure 4:
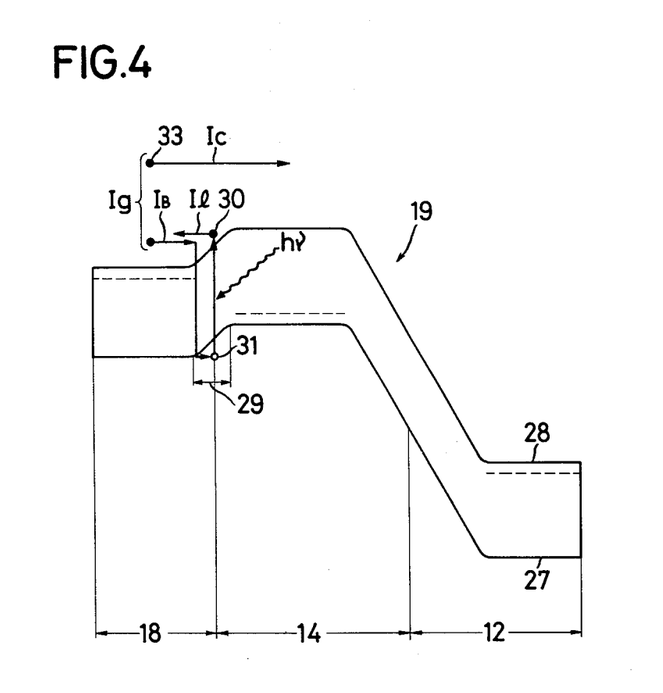
FIG. 4 is a graph representing energy levels of a transistor part of the photo FET of FIG. 3.

In FIG. 4, energy levels of the transistor 19 are shown. When light is irradiated onto the transistor 19, the transistor 19 absorbs energy $h\nu$ of photons of the light. Covalent bonds in the transistor 19 are broken and some electrons transit from a full band 27 to a conduction band 28. Accordingly, hole 31-electron 30 pairs are formed in a space charge region 29. The holes 31 are trapped in the P-type semiconductive region 14 to lower the potential thereof. Electrons 33 are injected into the P-type semiconductive region 14 from the N⁺-type semiconductive region 18 by a power source 32. A part of an emitter current $I_e$ of the electrons 33 flows as an electron current $I_B$ to recombine with the holes 31. On the other hand, since the photocurrent $I_e$ of the electrons 30 and the emitter current $I_B$ of the electrons 33 are maintained in the state of equilibrium, $I_e$ is considered to be equal to $I_B$. Accordingly, $I_e = I_B = (1-\alpha) I_g$, where $\alpha$ is a current reaching factor of the transistor 19 and $I_g$ a gate current of the FET 11 flowing through the transistor 19. The photocurrent $I_e$ flows through the diode formed by the N⁺-type semiconductive region 18 and the P-type semiconductive region 14. Accordingly, $I_g = I_e/(1-\alpha) \approx h_{FE} \times I_e$ flows through the transistor 19. The photocurrent is amplified by $h_{FE}$ times as much as the photocurrent $I_e$ of the conventional photo diode. Since also current of carriers generated by thermal excitation is amplified by $h_{FE}$ times as much as the current of thermally generated carriers of the convenional photodiode, signal to noise ratio S/N of the FET 11 is considered to be equal to that of the conventional photo-diode. Electrons generated within the diffusion length of the electron 30 from the space charge region 29 diffuse to contribute to the photocurrent. The change of the gate current $I_g$ is detected by that of the gate resistance between the N⁺-type semiconductive region 18 and the N⁻-type semiconductive region 12. For example, the voltage drops by about 10 V thereacross. At the case, the change of the potential of the N⁺-type semiconductive region 18 is considered to be that of the gate voltage of the FET 11.

Figure 5:
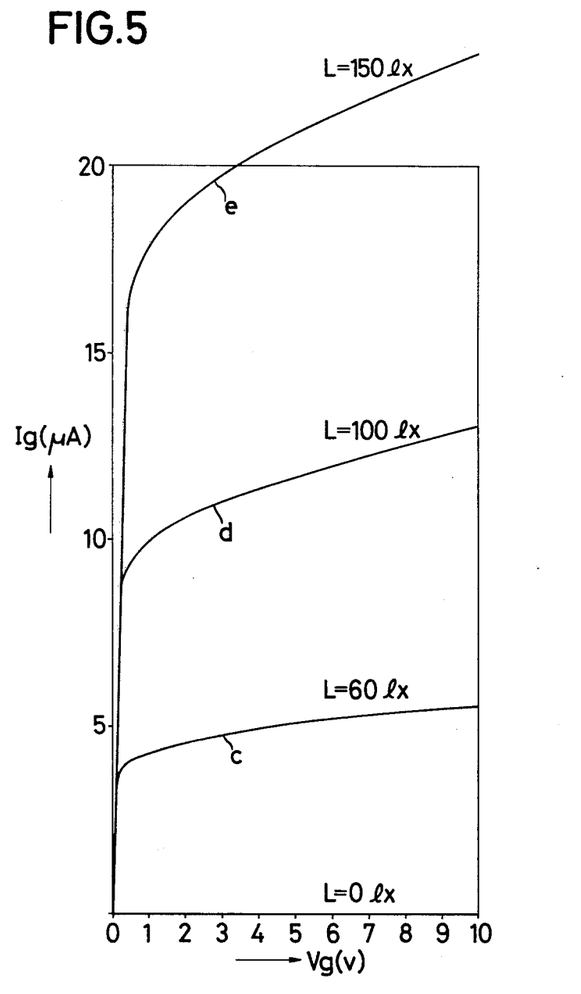
FIG. 5 is a graph representing the relationship between photocurrents or gate currents and gate voltages of the photo FET of FIG. 3.

FIG. 5 shows the relationship between the gate current $I_g$ and the intensity of illumination L of light. The photocurrent and therefore the gate current $I_g$ increase with the intensity of illumination L of light, as in FIG. 2. According to this embodiment, the photocurrent is $h_{FE}$ times, for example, eighty times as much as the photocurrent in FIG. 2. Accordingly, the resistance of the channel 15 can be changed widely in comparison with the conventional photo FET. Since the gate resistance $R_g$ can be reduced to about 1/80 of that of the conventional photo FET, it become very easy to design or handle the circuit. For example, when 1000 1× light is irradiated, the gate resistance $R_g$ can be about 60 KΩ which is about 1/80 of the gate resistance 5 MΩ of the conventional photo FET.

The above-mentioned photo FET can function also as a charge storage junction FET (hereafter called CSJ FET).

Figure 6:
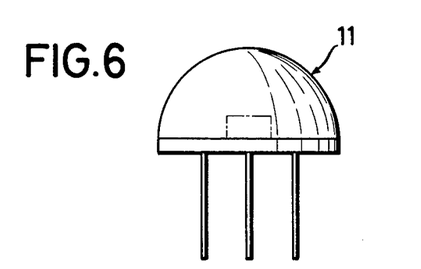
FIG. 6 is a schematic elevational view of a case containing the FET of FIG. 3.

In the photo FET 11 of FIG. 3, a gate control circuit is connected between the source electrode 24 and the gate electrode 26. A resistor R and a power source are connected between the source electrode 24 and the drain electrode 25. Output terminal (not shown) are connected both ends of the resistor R. The FET 11 is attached to a header and it is covered with a transparent cap through which light is irradiated onto the P-type semiconductive region 14 (FIG. 6).

Next, methods of use and operations of the above-mentioned CSJ FET 11 will be described.

Figure 7A:
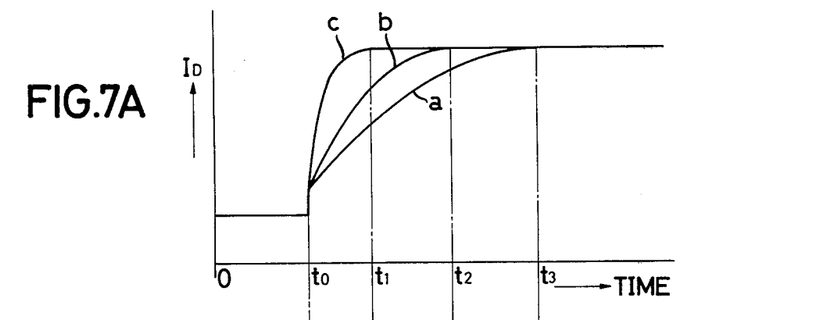
FIG. 7A is a graph representing changes of drain currents of the FET of FIG. 3.

A gate voltage $V_G$ is applied to the gate electrode 26 from the gate control circuit between the source electrode 24 and the gate electrode 26, so as to put the gate electrode 26 into negative potential. A PN junction between the N⁺-type semiconductive region 18 and the P-type semiconductive region 14 is forward-biased, while an other PN-junction between the P-type semiconductive region 14 and the N-type semiconductive region 12 is reverse-biased. Accordingly, the whole of the gate voltage is supplied to the PN-junction between the P-type semiconductive region 14 and the N⁻-type semiconductive region 12, so that a depletion layer spreads adjacent to the PN-junction between the PN-junction between the P-type semiconductive region 14 and the N⁻-type semiconductive region 12. The lateral channel 15 is narrowed, extending from the N⁺-type semiconductive region 16 as the source region to the N⁺-type semiconductive region 17 as the drain region. Accordingly, the resistance between the N⁺-type semiconductive region 16 and the N⁺-type semiconductive region 17 is increased. Also the conventional FET operates as above mentioned. The gate voltage $V_G$ is applied to the gate electrode 26 till time $t_o$ (FIG. 7B), when the resistance $R_{SD}$ of the channel become higher ($R_1$ in FIG. 7C) and so the drain current $I_D$ become lower (FIG. 7A).

When the gate voltage $V_G$ changes into zero, or when the gate electrode 26 is short-circuited to the source electrode 24, the P-type semiconductive region 14 is put into negative potential and the PN-junction between the N⁺-type semiconductive region 18 and the P-type semiconductive region 14 is reverse-biased.

Till the time $t_o$, the depletion layer between the P-type semiconductive region 14 and the N⁻-type semiconductive region 12 forms a capacitance $C_1$ to be charged by the electric charge $Q = C_1 \cdot V_G$ in the P-type semiconductive region 14.

Figures 8, 11:
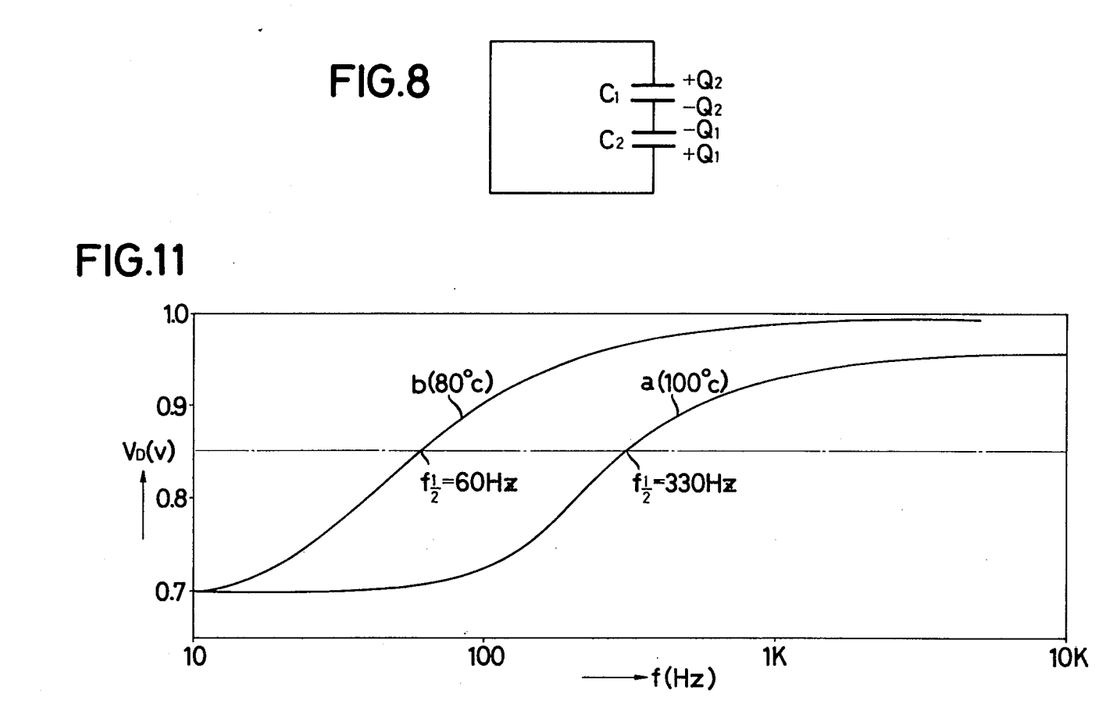
FIG. 8 is a circuit diagram equivalent to the junctions in the FET of FIG. 3.
FIG. 11 is a graph representing relationships between frequencies of gate voltages and DC output.

When the potential of the N⁺-type semiconductive region 18 becomes zero, or the short circuit is formed between the gate electrode 26 and the source electrode 24, the electric charge Q is shared into the capacitance $C_1$ between the regions 14 and 18, and a capacitance $C_2$ between the regions 14 and 12. As shown in FIG. 8, the CSJ FET 11 is equivalent to a circuit in which the capacitances $C_1$ and $C_2$ are connected in series with each other. From the view of the relationship between the P-type semiconductive region 14 and the ground level, the capacitances $C_1$ and $C_2$ are connected in parallel with each other. Therefore, $Q = Q_1 + Q_2 = C_1 V_x + C_2 V_x$, where the reverse-bias voltage $V_x = V_G \times C_1/(C_1+C_2)$. The depletion layer due to the voltage $V_x$ remains in the channel. The resistance $R_{SD}$ between the source region 16 and the drain region 17 is not rapidly lowered, but the stored charge is gradually lost by the reverse-current flowing through the PN-junctions represented by the $C_1$ and $C_2$. Since the stored charge is shared into both PN-junctions on the zero of the gate voltage $V_G$, the resistance $R_{SD}$ stepwisely decreases at the instant when the gate voltage $V_G$ becomes zero, and it gradually decreases thereafter.

Figure 7B:
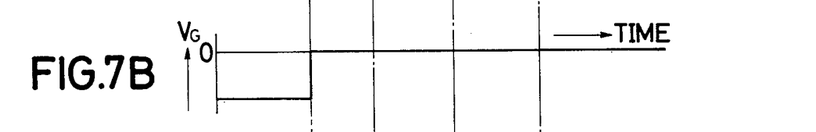
FIG. 7B is a graph representing a change of a gate voltage of the FET of FIG. 3.
Figure 7C:
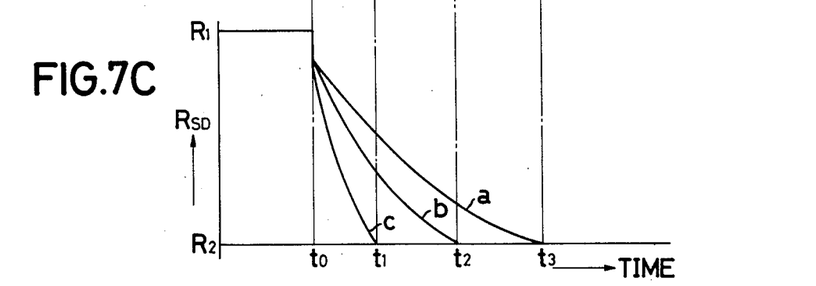
FIG. 7C is a graph representing changes of source-drain resistances of the FET of FIG. 3.

When no light is incident on the CSJ 11, the drain current $I_D$ relatively gradually increases and the source-drain resistance $R_{SD}$ relatively gradually decreases, as shown by curves $a$ in FIGS. 7A and 7C. In FIGS. 7A–7C, a time interval $t_o$–$t_3$ is about one second at a room temperature, one hundred seconds at a lower temperature, for example, −20° C, and one milliseconds at a higher temperature, for example, 100° C.

On the other hand, when light is incident on the CSJ FET 11, carriers (electrons and holes) are generated adjacent to the reverse-biased depletion layer, so that the reverse-current flowing the PN-junctions is increased and the decay time $t_D$ of the stored charge is shortened. For example, at the intensity L of illumination of 1000 1×, the time interval $t_o$–$t_3$ is under 0.1 millisecond. Curves $b$ in FIGS. 7A and 7C show characteristics at the low intensity of illumination, and curves $c$ in FIGS. 7A and 7C show characteristics at the high intensity of illumination. For example, the source drain resistance $R_{SD}$ is damped to $R_2$ in one second at the temperature of 20° C without incident light, while it is damped to $R_2$ in 0.1 second at the intensity 1 1× of illumination and in 0.01 second at the intensity 10 1× of illumination at the same temperature.

Consequently, the time when the $R_{SD}$ reaches the constant value $R_2$ varies at $t_1$, $t_2$ and $t_3$, as shown in FIGS. 7A and 7C.

Figure 9:
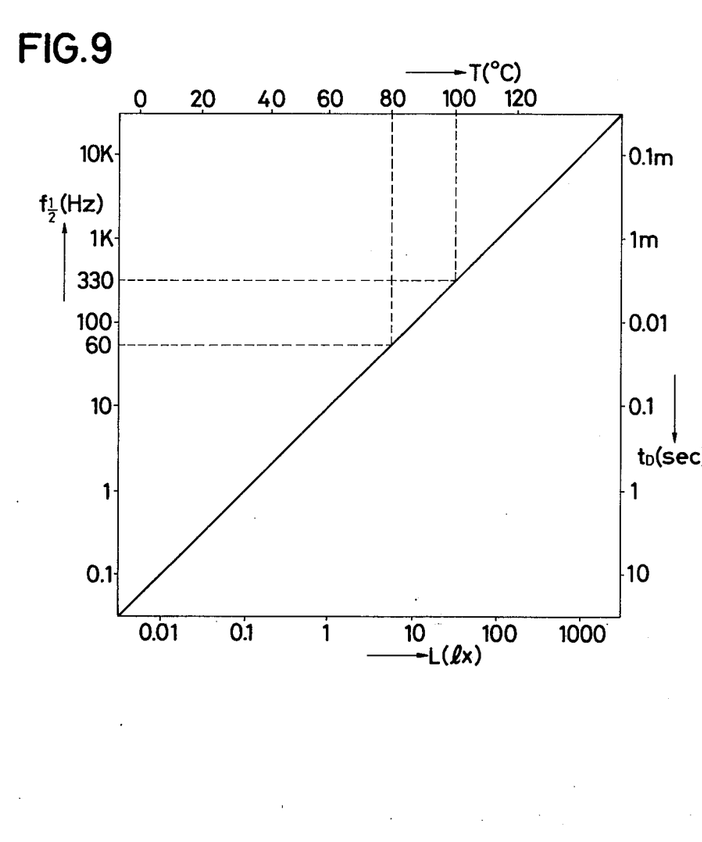
FIG. 9 is a graph representing the relationship among intensities of illumination of light, frequencies of gate voltages and decay times of the source-drain resistances.

FIG. 9 shows a decay characteristic with respect to the intensity of illumination L and the temperature T. It is understood that the decay time $t_D$ of the CSJ FET 11 varies proportionally to the intensity of illumination L or the temperature T and so the FET 11 can be adapted for use in a light-responding device or a heat-responding device.

In the above description, the DC voltage is applied to the gate electrode 26 and thereafter the gate electrode 26 is put into zero-potential. However, also then an AC voltage is applied to the gate electrode 26 by the gate control circuit, it is possible to obtain the light-responding device and the heat-responding device.

Figure 10A:
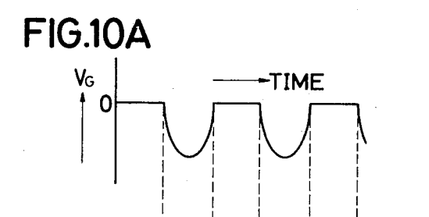
FIG. 10A and FIG. 10B show wave-forms of a AC gate voltage and a source-drain resistance.
Figure 10B:
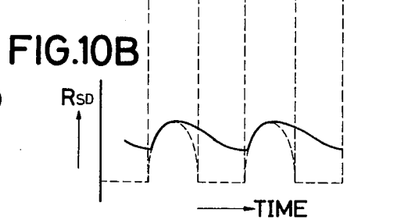

When a gate voltage $V_G$ as shown in FIG. 10A is applied to the gate electrode 26, the resistance $R_{SD}$ of the channel changes in a wave form corresponding nearly to the gate voltage $V_G$ in the conventional FET without the charge storage effect, as shown by a dotted line in FIG. 10B. On the other hand, since the FET 11 according to this invention has the charge storage effect, its $R_{SD}$ changes in lag behind the gate voltage $V_G$, as shown by a solid line in FIG. 10B. The lag depends on the intensity of illumination and the temperature. Since the source-drain resistance $R_{SD}$ varies with the current flowing therethrough, the source-drain resistance $R_{SD}$ can be detected in the form of a current or a voltage from the load resistor R. The lag can be checked by the DC component or AC component of the voltage applied across the resistor R. The higher the intensity of illumination, the smaller the DC component, and the lower the intensity of illumination, the larger the DC component. Moreover, the higher the temperature, the smaller the DC component, and the lower the temperature, the larger the DC component.

FIG. 11 shows frequency characteristics of the FET 11, which represents the relationship between the frequency of the gate voltage and the DC output when no light is incident on the FET 11. Curve $a$ in FIG. 11 represents the chracteristic at the temperature of 100° C, and curve b the characteristic at the temperature of 80° C. As shown in FIG. 11, $f_{1/2}$ varies with the temperature. $f_{1/2}$ represents the frequency where the DC output $V_D$ is the middle (0.85 V) between the DC output (1.0 V) at the infinitely large gate frequency and the DC output (0.7 V) at the infinitely small gate frequency. A 0.85 V-line of the DC-output intersects with the curve $a$ for the temperature of 100° C at the frequency $f_{1/2}$ of 300 Hz, and with the curve $b$ for the temperature of 80° C at the frequency $f_{1/2}$ of 60 Hz. When the frequencies $f_{1/2}$ are measured at many temperature-points, the relationship as shown in FIG. 9 can be obtained. And the relationship between the intensity of illumination L and the frequency $f_{1/2}$, is similar to the relationship between the temperature and the frequency $f_{1/2}$, as shown in FIG. 9. Since the intensity of illumination L and the temperature can be detected from the responce to AC signals, it is simple to arrange a circuit controlled by light or heat, or a circuit for detecting light or heat.

The transistor action of the $N^+$-type semiconductive region 18, the P-type semiconductive region 14 and the $N^-$-type semiconductive region 12 is not utilized for the CSJ FET. However, it is utilized for the photo FET.

The holes 31 or the electrons 30 may be electrically injected into the semiconductive region. Moreover, a semiconductor device may be of a vertical channel type. It can be used for different apparatus, for example, a light-detecting apparatus, a photometer and a time constant circuit.

Although an illustrative embodiment of this invention has been described in detail herein with reference to the accompanying drawings, it is to be understood that the invention is not limited to that precise embodiment, and that various changes and modifications may be effected therein by one skilled in the art without departing from the scope or spirit of this invention, as defined in the appended claims.

What is claimed is:

1. A field effect device for receiving light energy and producing output photo current indicative of the intensity of the light energy comprising a first semiconductor channel region of a first conductivity type, a second semiconductor gate region of second conductivity type adjoining said channel region, source and drain electrode regions formed at opposite ends of said channel region, a third semiconductor region of a first conductivity type formed in said gate region and having a gate electrode attached thereto, a gate control circuit connected between said gate and source electrodes for injecting minority carriers into said gate region from said third semiconductor region, and said third semiconductor region being spaced from said channel region by a predetermined distance smaller than the diffusion length of the minority carriers in said gate region, an output circuit connected between said source and drain electrode regions in said channel region varying in response to light energy incident on said field effect device.

2. A field effect device according to claim 1 further including a fourth semiconductor region of second conductivity type adjoining said first semiconductor channel region on the surface opposite said second semiconductor gate region.

* * * * *